United States Patent [19]

Osuch et al.

[11] Patent Number: 4,810,613
[45] Date of Patent: Mar. 7, 1989

[54] BLOCKED MONOMER AND POLYMERS THEREFROM FOR USE AS PHOTORESISTS

[75] Inventors: Christopher E. Osuch, Mine Hill; Michael J. McFarland, Bound Brook, both of N.J.

[73] Assignee: Hoechst Celanese Corporation, Somerville, N.J.

[21] Appl. No.: 52,950

[22] Filed: May 22, 1987

[51] Int. Cl.⁴ .......................................... G03C 1/495
[52] U.S. Cl. ................... 430/192; 430/193; 430/270; 430/326; 522/152; 522/131; 522/132; 522/63
[58] Field of Search ............... 430/281, 270, 132, 192, 430/193; 522/326, 287, 286, 152, 131, 132, 63

[56] References Cited

U.S. PATENT DOCUMENTS

| | | | |
|---|---|---|---|
| 3,046,123 | 7/1962 | Sus et al. | 96/33 |
| 3,515,552 | 6/1970 | Smith | 96/35.1 |
| 3,533,796 | 10/1970 | Lässig et al. | 430/193 X |
| 3,536,489 | 3/1984 | Smith | 96/28 |
| 3,779,778 | 12/1973 | Smith et al. | 96/115 R |
| 3,981,897 | 9/1976 | Crivello | 260/440 |
| 4,101,323 | 7/1978 | Buhr et al. | 96/35 |
| 4,450,360 | 5/1984 | Crivello et al. | 260/440 |
| 4,491,628 | 1/1985 | Ito et al. | 430/176 |
| 4,524,121 | 6/1985 | Gleim et al. | 430/192 X |
| 4,569,897 | 2/1986 | Kalyanaraman | 430/270 X |
| 4,699,867 | 10/1987 | Schneller et al. | 430/270 X |
| 4,720,445 | 1/1988 | Bahim et al. | 430/270 X |

Primary Examiner—Paul R. Michl
Assistant Examiner—Cynthia Hamilton
Attorney, Agent, or Firm—Plottel & Roberts

[57] ABSTRACT

A new monomer is used to prepare homo or copolymers containing blocked imide groups which are characterized by deblocking in two stages, first when acid catalyzed and thereafter in aqueous alkaline solutions. Such polymers are, therefore, especially useful in formulating positive photoresist cmpositions. The polymers are combined with a latent photoacid, which when exposed to actinic radiation removes the acid sensitive blocking moiety, preferably an acetal or ketal group, leaving a methylol group or substituted methylol group remaining attached to the nitrogen atom, which groups are subsequenctly removed by exposure to aqueous alkaline developing solutions, leaving only imide groups,

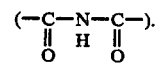

The new monomer is a derivative of maleimide in which the imide hydrogen has been replaced with a methylol group, which is subsequently reacted to form an acetal or ketal. Preferred monomers include N-(2,4-dioxa-3,3-dimethylpentyl)-2H,5H-2,5-dioxopyrrole and related compounds.

38 Claims, No Drawings

BLOCKED MONOMER AND POLYMERS THEREFROM FOR USE AS PHOTORESISTS

FIELD OF THE INVENTION

This invention relates to compositions suitable for use as photoresists. More particularly, a novel monomer has been discovered from which unique blocked polymers may be made. The blocked polymers are characterized by deblocking in two stages, the first when the photoresist is exposed to actinic radiation and the second druing the subsequent development of the latent image.

BACKGROUND OF THE INVENTION

As explained in co-pending application U.S. Ser. No. 814,591, it is known to combine latent photoacids such as esters of diazonaphthoquinone sulfonic acids with alkali soluble resins such as the well-known novolacs (phenol-formaldehyde condensation products) to form positive photoresist materials. The novolacs are soluble in aqueous alkaline solutions and consequently can be removed during the developing process. However, when the latent photoacid is an insoluble material, it prevents the composition from dissolving until exposed to actinic radiation. At that time, the photoacid becomes soluble in alkali, as in the novolac resin, so that the composition can be removed from those portions of a surface which have been exposed to radiation.

In recent years, there has been increased interest in using deep ultraviolet (DUV) radiation in order to improve the sharpness of the developed image, permitting smaller features to be reproduced. Unfortunately, the novolac polymers are not suitable for this use since they absorb significant amounts of DUV radiation and prevent the proper development of the desired image. Thus, materials which do not absorb DUV radiation have been sought. One example of such a product is the copolymer of maleimide and comonomers such as substituted styrenes as shown in U.S. Ser. No. 814,591. While such materials are relatively much more transparent to DUV radiation than are the novolacs, nevertheless there are certain disadvantages which have not been overcome with such compositions and further improvement is desirable. An improved polymer is shown in U.S. Ser. No. 829,874 in which the styrenes are replaced by various vinyl ethers or esters. Still further improvements have been sought.

Various workers in the field have described polymers which contained certain degradable groups, sometimes called "blocking groups", which permit the polymers' characteristics to be changed when acid is produced by irradiating the sensitizer (latent photoacid). If, for example, a blocking group is placed on a novolac resin, which in itself is soluble in aqueous alkaline developer solution, it can be transformed into an aqueous insoluble resin which resists the alkaline solution except in those areas in which the latent photoacid has been exposed, thereby releasing acid to effectively deblock (i.e., separate) the blocking groups from the novolac composition, so that it reverts to its normal alkaline soluble form. Such a procedure is disclosed by Smith et al. in U.S. Pat. No. 3,779,778. Ito et al. in U.S. Pat. No. 4,491,628 show a similar protolytic technique applied to a different polymer, a poly(hydroxystyrene).

In U.S. Ser. No. 832,116, blocking groups are applied to the maleimide-styrene or maleimide-vinylester or ether polymers of U.S. Ser. Nos. 814,591 and 829,874 in order to improve their performance. With regard to the polymer of U.S. Ser. No. 832,116, it has been found that appreciably better results are obtained than with the compositions shown in U.S. Ser. No. 814,591. However, the deblocking of the maleimide-styrene polymer requires precise control of the deblocking conditions, which takes place at relatively high temperatures. It would be preferable to have a material which is both capable of being deblocked at relatively moderate temperatures after the photoacid had been exposed to radiation, and requires less precise control of the deblocking conditions.

In U.S. Pat. No. 4,101,323 Buhr et al., teaches another aspect of the broad principle, i.e., removing blocking groups with acid generated by radiation exposure of a latent photoacid. Buhr's compound 76 could appear to be similar to the invention to be discussed below, but the blocking group of Buhr et al. would be split off entirely to form the soluble imide compound and, consequently, does not suggest the two-stage deblocking characteristic of the present invention. Also, Buhr's compound is not incorporated in a polymer and is intended for use in copying compositions.

A need remains for an improved photoresist composition, especially in the DUV region, which has better processing characteristics and produces the finer patterns which are desired.

SUMMARY OF THE INVENTION

A novel monomer is used to prepare homo or copolymers which will deblock in two stages during the processing of photoresist compositions containing such polymers. The polymers have an acid sensitive acetal or ketal moiety which is removed by a catalytic reaction when the photoacid is exposed to radiation, leaving the imide nitrogen atoms still blocked by a methylol group, or substituted methylol group, which is removed when the exposed composition is developed in an aqueous alkaline solution.

Polymers according to the invention contain sufficient latent imide groups

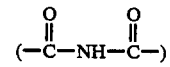

to render the polymer soluble in aqueous alkaline developing solutions, such imide groups are blocked by a methylol group, or a substituted methylol group, attached to an acetal or ketal group. The polymer may be a homopolymer of the novel monomers or a copolymer where the mol ratio of the comonomer to the latent imide group in the new monomer is up to about 5/1, preferably up to about 1/1.

The monomers may be generally represented by the structure:

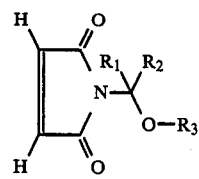

where:
$R_1$ and $R_2$ are H or $C_1$ to $C_4$ alkyl
$R_3$ is

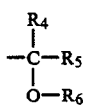

where:
$R_4$, $R_5$ are H or $C_1$ to $C_4$ alkyl
$R_6$ is $C_1$–$C_{10}$ alkyl
$R_7$ is $C_1$–$C_4$ alkyl or H or

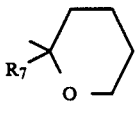

or

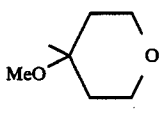

or

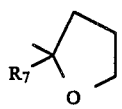

Certain of such monomers are considered to be novel compositions of matter, as will be seen in the detailed discussion to follow.

The polymers thus have the structures

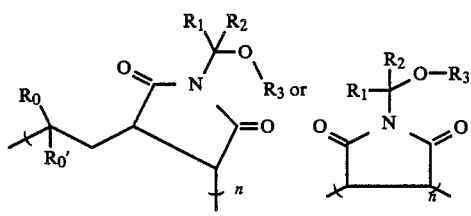

where:
$R_0$ is H or methyl
$R_0'$ is aryl, 0-alkyl, or 0-aryl
$R_1$, $R_2$, and $R_3$ are as defined above with respect to the monomer Particularly preferred embodiments include polymers where $R_0$ is H, $R_0'$ is phenyl, $R_1$ and $R_2$ are H.

Photoacids known in the art may be used, such as esters of diazonaphthoquinone sulfonic acids, alkyl halides, and onium salts. Preferred compositions employ iodonium or sulfonium salts, such as diphenyliodonium trifluoromethanesulfonate or triphenylsulfonium trifluoromethanesulfonate.

A photoresist composition according to the invention generally will comprise 1–40 wt. % of a latent photoacid, 60–99 wt. % of a polymer as described above, and 1–9 parts by weight relative to the combined photoacid and polymer of a suitable solvent capable of dissolving the other components.

A photoresist device according to the invention is made by placing the composition on a suitable substrate and evaporating the solvent according to practices familiar to those skilled in the art. It may then be exposed to radiation, especially deep ultraviolet (DUV) to form the desired pattern, heated as required to complete deblocking of the polymers, and developed using aqueous alkaline solutions. The resulting positive image is characterized by having sharp relief features which are stable to temperatures of about 230° C.

DESCRIPTION OF THE PREFERRED EMBODIMENTS

The Monomers

The new monomers form polymers useful in photoresists for microlithography. The blocked polymers formed from the monomers are insoluble in basic solutions and consequently resist the alkali developing solutions in areas where they have not been deblocked and provide a sharp demarcation of the boundaries of the areas exposed to radiation. Where the photoacid has provided a Bronsted acid by its rearrangement, the first blocking group is catalytically removed, leaving the second blocking group in place on the nitrogen atoms. The second blocking group is removed by exposure to aqueous alkali developing solutions, leaving only the unsubstituted imide

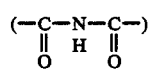

groups which are soluble in the alkaline solutions. The imide groups

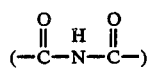

make polymers soluble in alkaline solutions, as explained in U.S. Ser. No. 814,591. This alkaline solubility facilitates removal of the polymers during development of the exposed image, but is undesirable in the unexposed portion. Consequently, the first blocking group, which is an acetal or ketal moiety, makes the unexposed portion insoluble in the alkaline developing solution. It has been found that the acetal or ketal groups cannot be readily added to the imide-containing portion of the monomer but they can be indirectly attached to the imide by first preparing methylol maleimide or a substituted equivalent and thereafter reacting a source of the desired acetal or ketal moiety. In describing the invention, "methylol" should be understood to mean the group —$CH_2OH$, or the substituted equivalents —$CR_1R_2OH$. Since the methylol maleimide (or a substituted equivalent thereof) is not unblocked by acid, but would be soluble in an alkaline developing solution, these compounds would be less useful in positive photoresist compositions. (An insoluble latent photoacid would be required to limit the dissolution of the polymer.) But with the acetal or ketal moiety in place, the monomer of the invention has the ability to unblock in two stages and when polymerized provides highly desirable properties to the photoresist composition.

The monomers may be generally represented by the following structure:

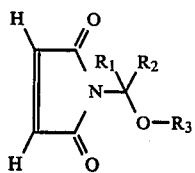

where $R_1$ and $R_2$ are H or $C_1$ to $C_4$ alkyl and $R_3$ is

where:
$R_4$, $R_5$ are H or $C_1$ to $C_4$ aklyl
$R_6$ is $C_1$-$C_{10}$ alkyl
$R_7$ is $C_1$-$C_4$ alkyl or H or

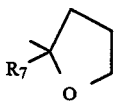

or

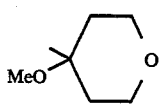

or

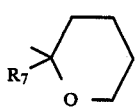

The monomer of the invention may be prepared by acid catalyzed reaction under anhydrous conditions of methylol maleimide (or a substituted equivalent) with compounds which provide $R_3$ groups defined above.

The intention is to create an acid degradable group which incorporates in it the methylol maleimide structure. The choice of $R_4$, $R_5$, $R_6$, and $R_7$ is made on the basis of availability of reagent, ease of reaction with methylol maleimide and the desired stability of the ultimate acid degradable polymer.

It is believed that at least some of the monomers have not been previously known and thus are novel per se. In particular, the following substituted maleimide compounds are considered new compositions of matter:

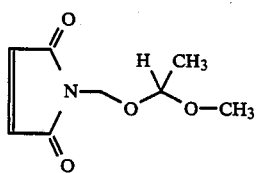

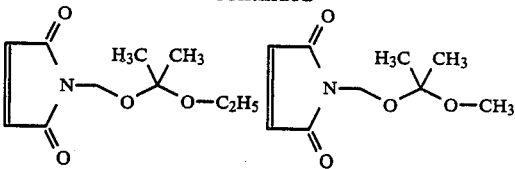

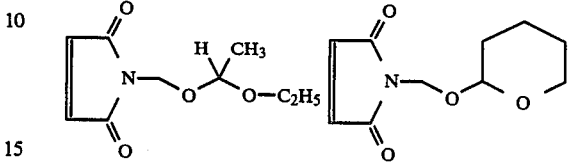

Particularly useful monomers are N-(2,4 dioxa-3,3-dimethyl pentyl)-2H,5H-2,5-dioxopyrrole and N-(2,4 dioxa-3-methyl pentyl)-2H,5H-2,5-dioxopyrrole.

The Polymers

The polymer resins suitable for use in photoresists consist of copolymers, or homopolymers, of the monomers of the invention which have the structures

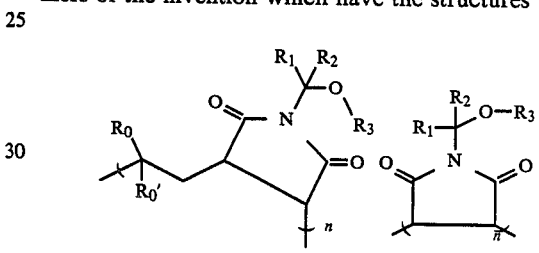

where:
$R_0$ is H or methyl
$R_0'$ is aryl, 0-alkyl, or 0-aryl
$R_1$, $R_2$, and $R_3$ are as defined above with respect to the monomer When $R_3$ is removed by the action of the photoacid, the methylol group (where $R_1$ and $R_2$ are H), or a substituted equivalent, remains attached to the nitrogen. These groups are removed by action of the alkaline developing solution to leave the polymer having the basic succinimide structure

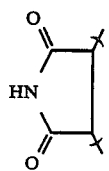

which is soluble in the alkaline solution, permitting complete removal of the exposed photoresist composition.

In general, these polymers can be prepared by standard free radical polymerization techniques from the monomers of the invention, either alone if homopolymer is desired, or by copolymerization with co-monomers which provide the $R_0$ and $R_0'$ groups defined above.

The polymers of the present invention must contain a proportion of acid degradable groups large enough to create a significant solubility difference between irradiated and unirradiated areas. Typically, the mol ratio of comonomer to substituted methylol maleimide will be between 0 (no comonomer) and 1. Particularly advantageous are ratios of 0 (homopolymer) and 1. If the amount of comonomer is greater, an adverse effect on solubility has been found and the mol ratio should not exceed about 5/1.

The comonomer may be chosen from a wide group of vinyl compounds, but most useful are electron-rich vinyl compounds such as styrenes or vinyl ethers. Electron-rich comonomers tend to give an alternating structure upon polymerization with the blocked methylol maleimide monomer. This has the advantage of creating a uniform polymer for which each molecular chain has approximately the same ratio of monomers without the use of special polymerization techniques such as polymerization to low percent conversion, feeding in one monomer during reaction, or using flow reactors. Preferred comonomers are styrene, α-methylstyrene, butyl vinyl ether, and butyl α-methylvinyl ether.

The free radical polymerization reaction can be run in solvents familiar to those skilled in the art, including ethyl acetate, cyclohexanone, tetrahydrofuran or toluene. The solvent should be chosen such that no free -OH groups are present. Additionally, the solvent should be acid and water free. Chain transfer agents such as thiols or disulfides may be added to control the final molecular weight of the polymer. The polymerization initiator chosen can be one known to those skilled in the art, the preferable initiators being bis-azo compounds such as azo-bis-isobutyronitrile, or most preferably 2,2'-azobis-(2,4-dimethyl-4-methoxyvaleronitrile). The optimum molecular weight is a function of the desired physical properties, including solution viscosity and tensile strength of the film. For higher strength, a higher molecular weight is desirable, however, for optimum solution properties as would affect, e.g., the spin coating process, a lower molecular weight is appropriate. Generally, the most useful molecular weights will fall within the range from 10,000 to 200,000.

The Photoresist Composition

In addition to the polymers discussed above, the photoresist composition will include a latent photoacid and a solvent and may optionally include stabilizers or other additives.

The latent photoacid of the present invention will be chosen from neutral substances capable of producing an acid after reaction with actinic radiation. The choice is determined by several factors, including the type of radiation to which sensitivity is desired. Clearly, the photoacid must absorb radiation at the frequency to be used, but it also must convert the radiation efficiently into the acid needed to deblock the polymers. In addition to being non-acidic, the unexposed, latent photoacid must not react with the polymer before exposure by actinic radiation and must be compatible with it, for example, the latent photoacid must not separate as a distinct macroscopic phase during preparation of the resist film. Also, the latent photoacid must not be so volatile that it tends to evaporate from the deposited film. Generally, the latent photoacids will have a boiling point of 150°–200° C. or higher. It is desirable that the latent photoacid not be unstable at temperatures below about 90° C., to allow for the possibility of a baking step, the purpose of which is to remove the resist solvent.

Suitable compounds include the class of diazonaphthoquinone sulfonate esters disclosed in U.S. Pat. No. 3,046,123 or the diazonium salts, iodonium and sulfonium salts disclosed in U.S. Pat. Nos. 3,981,897 and 4,450,360 or organic compounds having carbon halogen bonds such as those of U.S. Pat. Nos. 3,779,778, 3,515,552 and 3,536,489. Although carboxylic acids resulting from the diazonaphthoquinone sulfonate esters are strong enough acids to effect degradation, the preferred acids are the stronger acids derived from onium salts or halocarbons, such as hydrogen chloride, hydrogen bromide, or sulfonic acids.

Iodonium salts preferably are diaryliodonium salts such as di-4-methylphenyliodonium, di-4-methoxyphenyliodonium, and diphenyliodonium salts. Sulfonium salts preferably are triarylsulfonium salts such as tri-4-methylphenylsulfonium, tri-4-methoxyphenylsulfonium, and triphenylsulfonium salts. Most preferably, the iodonium or sulfonium salts are perfluoroalkane sulfonates, such as $C_1$ to $C_{10}$ straight chain alkane sulfonates, for example, perfluoropentane, perfluorooctane, and perfluoromethane sulfonates. The onium salts may also be hexafluorophosphates, tetrafluoroborates, or hexafluoroarsenates. Compounds particularly suitable for use in the present invention include 2,4-benzophenone-di-(1-oxo-2-diazonaphthoquinone-4-sulfonate), 4-methylbenzenediazonium tetrafluoroborate, diphenyliodonium hexafluorophosphate, triphenylsulfonium perfluorooctanesulfonate, tribromotrichloroethane, 2,4-bis-(trichloromethyl)-6-p-methoxystyryl-s-triazine, and the like.

The onium salts may incorporate an anion capable of absorbing actinic radiation and transferring energy to the cation. Examples of such anions are 4-nitronaphthalene-1-sulfonate, 4-methoxynaphthalene-1-sulfonate or naphthoquinone sulfonate.

The solvents suitable for preparation of resist solutions include the organic solvents not having free acid groups, for example, diglyme, dimethyl formamide, cyclohexanone, toluene, xylene, cellosolve acetate and the like.

We have found that small amounts of basic substances such as trialkyl amines will stabilize the resist solution by virtue of their ability to scavenge traces of acid which might be present, or might be generated during storage. It is most advantageous if the basic substance is volatile so that it is easily removed from the resist film after coating on the substrate. This allows full sensitivity of the resist during subsequent processing. However, if for some reason a resist less sensitive to actinic light is desired, nonvolatile basic substances which remain in the film to scavenge a portion of the generated photoacid may be beneficial.

Typical photoresist compositions according to the invention will comprise:
(a) 1 to 40 wt. % of a latent photoacid;
(b) 60 to 99 wt. % of a polymer which includes a novel monomer of the invention and characterized by two stage deblocking during actinic irradiation and developing;
(c) 1 to 9 parts by weight of a suitable solvent relative to the combined polymer and latent photoacid.

Using the Photoresist

The resist composition can be coated onto the substrate by one of several means known to those practicing the art, including spin coating, dip coating and roller coating. For purposes of microlithography, the optimum coating is from 0.5 to 2.5 $\mu$ meter in thickness and is applied by spin coating. After coating, the solvent may be removed by baking at a temperature from 35° to 90° C. for from 1 minute to 100 minutes. The resist film then may be exposed to actinic radiation through a mask to create a latent image. Although wavelengths of 230 nm to 500 nm may be used, for the preferred DUV (wavelengths from 245 nm to 300 nm) exposure, 0.5 to 50 mJ/cm$^2$ is appropriate. If electron beam radiation is used, a dose from 1 to 10 µ C/cm$^2$ is sufficient. In this latter situation, the use of larger doses can lead to cross-linking of the resist causing it to be negative acting whereas with DUV radiation it is positive acting. After exposure to actinic radiation, the resist coated substrate is allowed to stand in the ambient atmosphere for from 10 seconds to 100 minutes to permit deblocking of the polymer to proceed. If desired, the substrate can be heated to complete the deblocking reaction, to a maximum temperature of about 130° C.

After deblocking of the polymer, the resist is washed with an aqueous alkaline developer which removes the second blocking group and then dissolves away the exposed areas, leaving the unexposed regions behind. Satisfactory developers include aqeuous solutions of alkali metal hydroxides, quaternary ammonium hydroxides and strong organic bases such as choline. A preferred developer is a 0.1 M solution of a 1:1 mixture of tetrabutyl and tetramethyl ammonium hydroxides. The development time may be from 15 seconds to 15 minutes. The optimum time is about 1 to 2 minutes and with the preferred developer about 2 minutes is needed.

Using the composition of the present invention, relief features can be prepared which are stable to temperatures of about 230° C., depending somewhat on the composition of the polymer.

EXAMPLE 1

Preparation of Methylol Maleimide

Methylol maleimide was prepared via a modified method of Tawney, et al. [J. Org. Chem. (1961) 26, 15].

A 600 ml beaker was charged with 40.0 g of recrystallized maleimide, 25 ml of distilled water, and 34 ml of 37% formalin solution. Then 20 drops of triethyl amine were added, with stirring. The slurry was stirred for five hours at room temperature. Then 20 drops of concentrated HCl were added and the solution warmed to dissolve all the solids. The water was removed under vacuum and the resulting solid recrystallized from chloroform. The recovered product, m.p. 107.5–109.5, weighed 44.9 g (86% yield).

EXAMPLE 2

Reaction of Methylol Maleimide with 2-Methoxypropene

A 250 ml round bottom flask was charged with 11.03 g of dry methylol maleimide, 90 ml of dry chloroform, and 16 ml of 2-methoxypropene. Ten mg of p-toluenesulfonic acid were added, and the mixture was stirred for 70 minutes, by which time the solid had dissolved. Then 0.5 g of solid Na$_2$CO$_3$ were added to neutralize the acid. The solution was filtered and the solvent was removed to give an oil which solidified on standing. The weight of the recovered product, [N-(2,4-dioxa-3,3-dimethylpentyl)-2H,5H-2,5-dioxopyrrole] was 16.9 g (98% yield), m.p. 70.0°–71.5° C.

EXAMPLE 3

Reaction of Methylol Maleimide with Ethyl Vinyl Ether

A 25 ml round bottom flask was charged with 0.20 g of methylol maleimide, 2 ml CH$_2$Cl$_2$ and 0.15 ml ethyl vinyl ether. Two drops of trifluoroacetic acid were added, and the mixture was stirred for 2 hours by which time the solid had dissolved. Then 100 mg of Na$_2$CO$_3$ were added, the solution was filtered and the solvent was evaporated to yield 0.18 g. (58%) of N-(2,4-dioxa-3-methylhexyl)-2H,5H-2,5-dioxopyrrole, a white solid having m.p. 99°–100° C.

EXAMPLE 4

Reaction of Methylol Maleimide with Methyl Vinyl Ether

A cooled 50 ml round bottom, 3 neck flask was charged with 4 ml of methyl vinyl ether and 30 ml methylene chloride. The flask was cooled during charging with a dry ice, 2-propanol mixture. Thereafter, 4.0 gms of dry methylol maleimide were added along with 5 mg of p-toluene sulfonic acid. The solution was warmed to room temperature and stirred. After 2 hours another 5 mg portion of p-toluenesulfonic acid was added. After 3 hours, 0.5 g of solid potassium carbonate was added to neutralize the acid. The solution was then filtered and the solvent removed under vacuum. The liquid which resulted was dissolved in 20 ml of a 50/50 pentane/toluene mixture, from which unreacted methylol maleimide precipitates. The solid was filtered off and the filtrate was concentrated under vacuum to yield 4.75 gms of a colorless liquid. The properties were consistent with the structure of N-(2,4-dioxa-3-methylpentyl)-2H,5H-2,5-dioxopyrrole.

EXAMPLE 5

Reaction of Methylol Maleimide with Dihydropyran

The experiment of Example 3 is repeated except that the vinylether used is dihydropyran.

EXAMPLE 6

Reaction of Methylol Maleimide with 5,6-dihydro-4-methoxy-2H-pyran

The experiment of Example 3 is repeated except that the vinyl ether used is 5,6-dihydro-4-methoxy-2H-pyran.

EXAMPLE 7

Polymerization of Styrene with N-(2,4-dioxa-3,3-dimethylpentyl)-2H,5H-2,5-dioxopyrrole A 100 ml round bottom flask was charged with 6.00 g of N-(2,4-dioxa-3,3-dimethylpentyl)-2H,5H-2,5-dioxopyrrole, 32 ml of toluene, 2.12 g of purified styrene, 0.18 ml of dodecanethiol and 60 mg of Vazo-33 initiator [2,2'-azobis-(2,4-dimethyl-4-methoxyvaleronitrile)]. The whole was heated with stirring to 35° C. After 2 hours and 30 minutes the contents of the flask were poured into pentane, then the solids were filtered from the pentane, washed with methanol and dried. 6.85 g of white solid were recovered (75% yield).

EXAMPLE 8

Polymerization of Styrene with N-(2,4-dioxa-3-methylpentyl)-2H,5H-2,5-dioxopyrrole A 100 ml round bottom flask was charged with 2.67 gm of purified styrene, 4.75 gm of N-(2,4-dioxa-3-methylpentyl)-2H,5H-2,5-dioxopyrrole, 25 ml toluene, 0.15 ml dodecanethiol, and 50 mg Vazo 33. The mixture was heated to 35° C. and stirred for 5 hours, after which the mixture was poured into 80 ml of pentane, the solids filtered from the pentane and washed with pentane, and then ethyl ether, and dried under a stream of nitrogen. The yield of polymer was 6.34 g (85% of theoretical).

EXAMPLE 9

Polymerization of Styrene with N-(2,4-dioxa-3-methylhexyl)-2H,5H-2,5-dioxopyrrole The experiment of Example 7 is repeated except that N-(2,4-dioxa-3-methylhexyl)-2H,5H-2,5-dioxopyrrole is substituted for N-(2,4-dioxa-3,3-dimethylpentyl)-2H,5H-2,5-dioxopyrrole.

EXAMPLE 10

Polymerization of Styrene with N-(2-tetrahydropyranyloxymethyl)-2H,5H-2,5-dioxopyrrole The experiment of Example 7 is repeated except that N-(2-tetrahydropyranyloxymethyl)-2H,5H-2,5-dioxopyrrole is substituted for N-(2,4-dioxa-3,3-dimethylpentyl)-2H,5H-2,5-dioxopyrrole.

EXAMPLE 11

Polymerization of Styrene with N-(4-methoxy-4-tetrahydropyranyloxymethyl)-2H,5H-2,5-dioxopyrrole The experiment of Example 7 is repeated except that N-(4-methoxy-4-tetrahydropyranyloxymethyl)-2H,5H-2,5-dioxopyrrole is substituted for N-(2,4-dioxa-3,3-dimethylpentyl)-2H,5H-2,5-dioxopyrrole.

EXAMPLE 12

Polymerization of α-Methylstyrene with N-(2,4-dioxa-3,3-dimethylpentyl)-2H,5H-2,5-dioxopyrrole The experiment of Example 7 is performed except that α-methylstyrene is substituted for styrene and the reaction time is extended to 8 hours to allow for the lower rate of co-polymerization.

EXAMPLE 13

Polymerization of Decyl Vinyl Ether with N-(2,4-dioxa-3,3-dimethylpentyl)-2H,5H-2,5-dioxopyrrole The experiment of Example 7 is repeated except that decyl vinyl ether is substituted for styrene and the reaction time is extended to 4 hours.

EXAMPLE 14

The Base Solubility of Methylol Maleimide Styrene Copolymer

Styrene methylol maleimide copolymer was prepared by copolymerizing styrene (0.9 g) with methylol maleimide (1.0 g) in 10 ml cyclohexanone at 70° C. using azobisisobutylronitrile as an initiator for a period of 3 hours. The polymer was isolated by trituration of the solid, cooled reaction mixture with methanol. A sample of the polymer was examined by $^1$H/NMR (proton nuclear magnetic resonance) and found to have a spectrum consistent with the assigned composition. An IR spectrum of a film prepared from DMF solution showed a band in the region where OH stretching is expected. The polymer was found to be insoluble in water, but soluble in dilute tetramethyl ammonium hydroxide solution. A film treated with ammonia vapor gave an IR spectrum which no longer had the band associated with the —CH$_2$OH group but which conformed to the spectrum of maleimide styrene copolymer.

EXAMPLE 15

Preparation and Use of Photoresist

A photoresist solution was prepared by dissolving 1 part of diphenyliodonium trifluoromethanesulfonate and 9 parts of the resin from Example 7 in 39.7 parts of 2-methoxyethyl ether. The resist solution was filtered through a 0.2 μm PTFE filter into a clean glass vessel. The filtered solution was spin coated onto clean silicon wafers using a Headway Research spin coater operated at 3000 rpm. After coating, the wafers were baked at 80° C. for 15 minutes to remove residual solvent. Wafers were exposed to deep ultraviolet (DUV) light from an Optical Associates Series 30, 500 watt Hg-Xe light source fitted with DUV optics. The output light was further filtered through a 260±15 nm filter (Omega Optical) to insure that only DUV light fell on the resist. The lithographic pattern was provided by a chrome-on-quartz mask (Optoline, Ditric Optics) which was held onto the wafer surface with vacuum. After exposure, the wafers were developed by dipping in a 0.1M aqueous solution of (1:1) tetramethyl and tetrabutyl ammonium hydroxide for a period of 1 minute, followed by a rinse in deionized water. The exposed areas were cleared out with a bulk sensitivity of 2.2 mJ/cm$^2$. Line/space patterns of 1 μm dimension on the mask were well resolved in the photoresist, thus forming a microrelief pattern on the silicon wafer surface.

EXAMPLE 16

Resist-coated wafers were prepared and exposed as in Example 15 except that the wafers were baked for 1 minute at 55° C. after exposure and before development. The baked wafers were developed for 1.5 minutes in the developer of Example 15 to give a cleared positive relief pattern on the silicon. The bulk exposure energy required to clear was 1.5 mJ/cm$^2$. This indicates that the resist can be processed either with or without a baking step between exposure and development.

EXAMPLE 17

A resist solution was prepared from 1 part diphenyliodonium trifluoromethanesulfonate, 12 parts of polymer prepared as in Example 7 and 43.5 parts of 2-methoxyethyl ether containing a trace of triethylamine. The resist solution was filtered and spin coated and baked (as in Example 15) on 5 inch oxide-coated silicon wafers. The coated wafers were exposed with a Perkin-Elmer Micralign TM -500 projection scanner in the UV-2 region (DUV) with a dose of 12 mJ/cm$^2$. Following exposure, the wafers were heated three different ways before developing: (1) 3 minutes at room temperature, (2) 1 minute at 70° C., and (3) 1 minute at 97° C. All were followed by 2 minute development in the developer of Example 15. All three processes produced well resolved line/space patterns of 1 μm nominal dimension. SEM examination revealed that line widths and profiles were the same, showing that the post-exposure temperature latitude of this material is much superior to that of poly(N-tert-butoxycarbonyl maleimide-co-styrene) of U.S. Application Ser. No. 832,116. In addition, this example indicates that a trace of volatile amine added to scavenge acid does not interfere with the lithography if the wafers are soft baked before exposure.

EXAMPLE 18

A photoresist solution is prepared in the manner of Example 15 except the polymer used is that of Example 12. The resist is filtered, coated, exposed and developed according to the method of Example 15 to produce high resolution relief patterns.

EXAMPLE 19

A photoresist solution is prepared in the manner of Example 15 except the polymer used is that of Example 13. The resist is filtered, coated, exposed and developed according to the method of Example 15 to produce high resolution relief patterns.

EXAMPLE 20

A photoresist solution is prepared in the manner of Example 15 except the polymer used is that of Example 9. The resist is filtered, coated, exposed, baked and developed according to the method of Example 16 to produce high resolution relief patterns.

EXAMPLE 21

A photoresist solution is prepared in the manner of Example 15 except the polymer used is that of Example 10. The resist is filtered, coated, exposed, baked and developed in the manner of Example 16 to produce high resolution relief patterns.

EXAMPLE 22

A photoresist solution is prepared in the manner of Example 15 except the polymer used is that of Example 11. The resist is filtered, coated, exposed, baked and developed according to the method of Example 16 to produce high resolution relief patterns.

EXAMPLE 23

A photoresist solution was prepared in the manner of Example 15 except the polymer used is that of Example 8. The resist is filtered, coated, exposed, baked and developed according to the method of Example 16. A high resolution relief pattern was produced. Some crosslinking occurred in the irradiated areas and cleanout of small feature holes was adversely affected.

EXAMPLE 24

Comparative

Maleimide (0.1 g), 1 ml toluene, and 1.15 ml 2-methoxypropene were mixed in a round bottomed flask. Para-toluene sulfonic acid (0.5 mg) was added as a catalyst. Unlike Example 2 where methylol maleimide was used instead of maleimide, the solution became yellow and then red orange. After 30 minutes the solution was nearly opaque. The solid maleimide did not dissolve. The solvent was vaporized into a nitrogen stream and the residue examined by $^1$H/NMR. The only identifiable material was unreacted maleimide. It was concluded that the desired reaction of maleimide and 2-methoxypropene had not occurred.

EXAMPLE 25

Comparative

Poly(N-methylol maleimide-co-styrene) polymer was dissolved in N,N-dimethyl formamide and spin-coated on discs of polished sodium chloride. These were baked 20 minutes at 80° C. to remove the DMF solvent, leaving the dry polymer as a transparent film approximately 1 m thick on the discs. The discs were mounted in the sample beam of a Perkin-Elmer infrared spectrometer and the infrared spectra of the polymer was recorded. One disc was placed in a closed vessel with HCl vapor for a period of 30 minutes and then removed and baked for 10 minutes at 130° C. After the acid treatment, the infrared spectra of the film was identical to that of the untreated film, indicating that the acid did not deblock the polymer.

Another polymer coated disc was exposed to ammonia vapor for 20 minutes, after which the infrared spectrum was much different from the untreated disc. Absorption bands at 1060 cm$^{-1}$ and 3475 cm$^{-1}$ which are associated with the methylol group had disappeared, indicating that base had deblocked the polymer.

In still another sample, the polymer was thermally degraded at 190° C. The infrared spectrum indicated that the methylol group had been removed and the band associated with the free imide appeared at 3250 cm$^{-1}$.

It was concluded that polymers prepared from methylol maleimide are not useful in positive protolytic photoresists, but require the addition of blocking groups according to the invention.

EXAMPLE 26

Comparative

Poly(p-tert-butoxycarbonyloxystyrene) was prepared by the method of example D-1 of U.S. Pat. No. 4,491,628. A photoresist solution was prepared by dissolving 1 part of diphenyliodonium trifluoromethane sulfonate and 9 parts of poly (p-tert-butoxycarbonyloxystyrene) in 23.3 parts of 2-methoxyethyl ether. The solution was used to coat silicon wafers which were then processed as in Example 16 except that the post exposure bake was at 90° C. for 2 minutes and the developer had a concentration of 0.5 M. The bulk exposure energy required to clear the exposed area was 3 to 4 mJ/cm$^2$ (compared to 1.5 mJ/cm$^2$ for Example 16). The resist images were then baked to determine their useful temperature range. It was found that the images exhibited rounding (plastic reflow) at 120° C., while the images prepared in Example 16 do not show any rounding at temperatures up to 220° C. It was concluded that the performance of photoresist compositions of the present invention are superior to those of U.S. Pat. No. 4,491,628.

EXAMPLE 27

A photoresist composition was prepared as in Example 15 except that diphenyliodonium tetraphenylborate was substituted for diphenyliodonium trifluoromethanesulfonate. Wafers were prepared and processed in the manner of Example 16. The resist showed no tendency to become soluble in aqueous base even at irradiation doses up to 200 mJ/cm$^2$. It was concluded that the presence of a diphenyliodonium group (or other onium group) was insufficient to define useful compounds of this type and that the anion must be capable of reacting to produce a Bronsted acid. Accordingly, the related compound, diphenyliodonium tetrafluoroborate would be expected to act as a photosensitizer.

EXAMPLE 28

A photoresist was prepared in the manner of Example 15, except that triiodomethane was substituted for diphenyliodonium trifluoromethanesulfonate. Wafers were prepared and processed as in Example 16. The test images required 14 mJ/cm² to clear the resist from the exposed area. It was concluded that organic compounds with carbon-halogen bonds will serve as useful latent photoacids for this invention.

We claim:
1. A photoresist composition comprising:
   (a) a polymer containing imide groups blocked by a methylol group or substituted methylol group further blocked to form an acetal or ketal moiety;
   (b) a latent photoacid in an amount sufficient to remove said acetal or ketal groups of (a) causing the formation of methylol or substituted methylol groups by action of the acid produced from said photoacid by exposure to radiation of the desired wavelength;
   (c) a solvent capable of dissolving the polymer of (a) and the latent photoacid of (b).
2. The photoresist composition of claim 1 wherein said polymer of (a) is a homopolymer of blocked maleimide.
3. The photoresist composition of claim 1 wherein said polymer of (a) is a copolymer containing no more than 5 units of the comonomer for each blocked imide group.
4. The photoresist composition of claim 3 wherein said copolymer contains up to about one unit of comonomer for each blocked imide group.
5. A photoresist composition comprising:
   (a) 1 to 40 wt. % of a latent photoacid;
   (b) 60 to 99 wt. % of a polymer with the structure

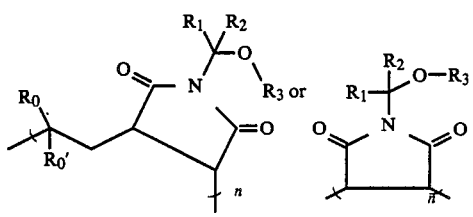

where:
$R_0$ is H or methyl
$R_0'$ is aryl, O-alkyl, or O-aryl
$R_1$ and $R_2$ are H or $C_1$ to $C_4$ alkyl
$R_3$ is

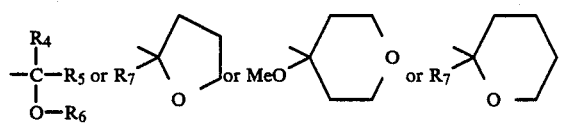

where:
$R_4$, $R_5$ are H or $C_1$ to $C_4$ alkyl
$R_6$ is $C_1$ to $C_{10}$ alkyl
$R_7$ is $C_1$ to $C_4$ alkyl or H
   (c) 1 to 9 parts by weight of a solvent relative to (a)+(b) capable of dissolving both polymer and latent photoacid.
6. The photoresist composition of claim 5 wherein $R_0'$ is aryl or substituted aryl.
7. The photoresist composition of claim 6 wherein $R_0'$ is phenyl.
8. The photoresist composition of claim 5 wherein $R_0'$ is -O-($C_1$ to $C_{10}$ alkyl) or -O-aryl.
9. The photoresist composition of claim 8 wherein $R_0'$ is -O-(n-decyl).

10. The photoresist composition of claim 5 wherein $R_0'$ is phenyl and $R_3$ is $-C(CH_3)_2OCH_3$.
11. The photoresist composition of claim 5 wherein $R_0'$ is phenyl and $R_3$ is $-C(CH_3)(H)OCH_3$.
12. The photoresist composition of claim 5 wherein $R_0'$ is phenyl and $R_3$ is

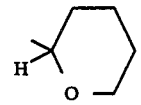

13. The photoresist composition of claim 5 wherein $R_0'$ is phenyl and $R_3$ is

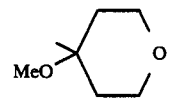

14. The photoresist composition of claim 1 wherein a sulfonate ester of a 2-diazonaphthoquinone is the latent photoacid.
15. The photoresist composition of claim 1 wherein an iodonium salt is the latent photoacid.
16. The photoresist composition of claim 15 wherein the iodonium salt is a diaryliodonium salt.
17. The photoresist composition of claim 16 wherein the diaryliodonium salt is a 4-methylphenyliodonium salt.
18. The photoresist composition of claim 16 wherein the diaryliodonium salt is a 4-methoxyphenyliodonium salt.
19. The photoresist composition of claim 16 wherein the diaryliodonium salt is a diphenyliodonium salt.
20. The photoresist composition of claim 1 wherein a sulfonium salt is the latent photoacid.
21. The photoresist composition of claim 20 wherein the sulfonium salt is a triarylsulfonium salt.
22. The photoresist composition of claim 21 wherein the triarylsulfonium salt is a 4-methylphenylsulfonium salt.
23. The photoresist composition of claim 21 wherein the triarylsulfonium salt is a 4-methoxyphenylsulfonium salt.
24. The photoresist composition of claim 21 wherein the triarylsulfonium salt is a triphenylsulfonium salt.
25. The photoresist composition of claims 15 and 20 wherein the salt is an onium perfluoroalkanesulfonate.
26. The photoresist composition of claim 25 wherein the perfluoroalkanesulfonate is a $C_1$ to $C_{10}$ straight chain alkanesulfonate.
27. The photoresist composition of claim 25 wherein the perfluoroalkanesulfonate is chosen from the group: perfluoropentanesulfonate, perfluorooctanesulfonate, perfluoromethanesulfonate.
28. The photoresist compositions of claims 15 and 20 wherein the salt is an onium hexafluorophosphate.
29. The photoresist compositions of claims 15 and 20 wherein the salt is an onium tetrafluoroborate.
30. The photoresist compositions of claims 15 and 20 wherein the salt is an onium hexafluoroarsenate.
31. The photoresist compositions of claim 1 wherein a low volatility halocarbon is the latent photoacid.
32. The photoresist compositions of claim 31 wherein the halocarbon is 2,4-bis-(trichloromethyl)-6-p-methoxystyryl-s-triazine.

33. The photoresist compositions of claims 15 or 20 wherein said salt incorporates an anion capable of absorbing actinic radiation and transferring energy to the cation.

34. A photoresist device comprising a substrate having disposed thereon a film comprising:
 (a) a polymer containing imide groups blocked by a methylol group or substituted methylol group further blocked to form an acetal or ketal moiety;
 (b) a latent photoacid in an amount sufficient to remove said acetal or ketal groups of (a) causing the formation of methylol or substituted methylol groups by action of the acid produced from said photoacid by exposure to radiation of the desired wavelength.

35. A photoresist device of claim 34, wherein said polymer of (a) is a homopolymer of blocked maleimide.

36. A photoresist device of claim 34, wherein said polymer of (a) is a copolymer containing no more than 5 units of the comonomer for each blocked imide group.

37. A photoresist device of claim 35, wherein said copolymer contains up to about one unit of comonomer for each blocked imide group.

38. A photoresist device of claim 34 wherein said acetal or ketal group has been removed by exposure to actinic radiation and leaving the nitrogen atoms of said imide group attached only to said methylol group or substituted methylol group.

* * * * *